(12) United States Patent
Kwon et al.

(10) Patent No.: US 10,381,429 B2
(45) Date of Patent: Aug. 13, 2019

(54) DISPLAY DEVICE

(71) Applicant: LG DISPLAY CO., LTD., Seoul (KR)

(72) Inventors: Sunyoung Kwon, Paju-si (KR); Dosung Kim, Paju-si (KR); Seyoung Kim, Paju-si (KR); Ryosuke Tani, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 15 days.

(21) Appl. No.: 15/661,827

(22) Filed: Jul. 27, 2017

(65) Prior Publication Data

US 2018/0033852 A1 Feb. 1, 2018

(30) Foreign Application Priority Data

Jul. 29, 2016 (KR) .................. 10-2016-0097494

(51) Int. Cl.
| | |
|---|---|
| *G02F 1/1345* | (2006.01) |
| *H01L 27/32* | (2006.01) |
| *G09G 3/36* | (2006.01) |
| *G09G 3/20* | (2006.01) |
| *H01L 27/12* | (2006.01) |

(52) U.S. Cl.
CPC ...... *H01L 27/3279* (2013.01); *G02F 1/13458* (2013.01); *G09G 3/2096* (2013.01); *H01L 27/3276* (2013.01); *H01L 27/3297* (2013.01); *G09G 2300/0426* (2013.01); *H01L 27/1244* (2013.01); *H01L 2251/5392* (2013.01)

(58) Field of Classification Search
CPC ... H01L 27/1214–1296; H01L 27/3297; H01L 27/3244–3279; H01L 2251/5338; H01L 2251/5392; H01L 27/3276; H01L 51/0097; G02F 1/1333–3476; G02F 1/1362–1368; G02F 1/13458; G09G 2300/0426; G09G 3/3233; G09G 2380/02
See application file for complete search history.

(56) References Cited

U.S. PATENT DOCUMENTS 8,648,786 B2 * 2/2014 Lee ...................... G02F 1/1345
345/92
2004/0150319 A1 8/2004 Tomimatsu et al.
(Continued)

FOREIGN PATENT DOCUMENTS

| CN | 104716156 A | 6/2015 |
|---|---|---|
| TW | I323378 B | 4/2010 |

(Continued)

*Primary Examiner* — Eric A. Ward
(74) *Attorney, Agent, or Firm* — Birch, Stewart, Kolasch & Birch, LLP

(57) ABSTRACT

A display device for preventing a defective drive and improving reliability is disclosed. The display device includes a substrate including a display portion and a pad portion outside the display portion, a plurality of power lines positioned on the pad portion of the substrate and extended from the display portion, a plurality of data lines positioned in parallel with the plurality of power lines and extended from the display portion, and a plurality of bridge electrodes configured to connect at least two of the plurality of power lines. Some of the plurality of power lines include a power pad electrode on at least an end of the corresponding power line, and a number of the power pad electrodes is less than a number of the power lines.

20 Claims, 12 Drawing Sheets

(56) References Cited

U.S. PATENT DOCUMENTS

| | | | |
|---|---|---|---|
| 2006/0145606 A1 | 7/2006 | Lee | |
| 2007/0075329 A1 | 4/2007 | Kim | |
| 2014/0022230 A1* | 1/2014 | Hasumi | G09G 3/3696 345/212 |
| 2014/0055702 A1* | 2/2014 | Park | G02F 1/136286 349/43 |
| 2014/0145171 A1 | 5/2014 | Park et al. | |
| 2014/0353632 A1* | 12/2014 | Park | H01L 27/3279 257/40 |

FOREIGN PATENT DOCUMENTS

| | | |
|---|---|---|
| TW | 201030966 A1 | 8/2010 |
| TW | I371988 B | 9/2012 |
| TW | I379614 B1 | 12/2012 |

* cited by examiner

DISPLAY DEVICE

This application claims the priority benefit of Korean Patent Application No. 10-2016-0097494 filed on Jul. 29, 2016, which is incorporated herein by reference for all purposes as if fully set forth herein.

BACKGROUND OF THE INVENTION

Field of the Invention

The present disclosure relates to a display device, and more particularly, to a display device for preventing a defective drive and improving reliability.

Discussion of the Related Art

With the development of information society, demands for display devices displaying an image are increasing in various ways. In a field of the display devices, a large-sized cathode ray tube (CRT) has been rapidly replaced by a flat panel display (FPD) having advantages of a thin profile, low weight, and a large-sized screen. Examples of the flat panel display include a liquid crystal display (LCD), a plasma display panel (PDP), an organic light emitting diode (OLED) display, and an electrophoresis display (EPD).

An OLED display includes self-emitting elements capable of emitting light by themselves and has advantages of a fast response time, a high emission efficiency, a high luminance, and a wide viewing angle. In particular, the OLED display may use a flexible plastic substrate. In addition, the OLED display has advantages of a lower driving voltage, lower power consumption, and better color tone as compared to a plasma display panel or an inorganic electroluminescent display.

The OLED display generally includes a display portion including a plurality of subpixels and a non-display portion outside the display portion. Each of the plurality of subpixels constituting the display portion includes a switching transistor turning on and off the subpixel through a gate line and a data line, a driving transistor driving the subpixel through a power line, and an organic light emitting diode (OLED) emitting light through the driving transistor. The non-display portion includes a pad on which various signal lines including the gate lines, the data lines, the power lines, etc. are disposed to be extended from the display portion and connected to an external circuit board. The pad includes a plurality of pad electrodes so that the pad is connected to a film-on-glass (FOG). The pad electrodes are connected to the various signal lines, for example, the data lines and the power lines extended from the display portion and have the same number as the number of signal lines connected.

However, as a resolution increases, the number of pad electrodes increases. Therefore, a pitch of the pad electrodes is reduced. Further, when the OLED display senses the subpixels using an external compensation method, sensing lines are required. Hence, the pitch of the pad electrodes is further reduced. When the pitch of the pad electrodes is reduced, a fine short circuit between the pad electrodes may be generated in a grinding process of a glass substrate due to foreign substance of metal, residues, conductive particles (for example, anisotropic conductive film (ACF)), etc., causing problems of a defective drive and a reduction in reliability of the OLED display.

SUMMARY OF THE INVENTION

The present disclosure provides a display device capable of increasing a pitch of pad electrodes of a pad.

The present disclosure also provides a display device capable of preventing a defective drive and improving reliability.

In one aspect, there is provided a display device including a substrate including a display portion and a pad portion outside the display portion, a plurality of power lines positioned on the pad portion of the substrate and extended from the display portion, a plurality of data lines positioned in parallel with the plurality of power lines and extended from the display portion, and a plurality of bridge electrodes configured to connect at least two of the plurality of power lines, wherein some of the plurality of power lines include a power pad electrode on at least an end of the corresponding power line, and a number of the power pad electrodes is less than a number of the power lines.

The plurality of bridge electrodes intersects the plurality of power lines and the plurality of data lines.

The display device further includes a plurality of auxiliary electrodes positioned between the plurality of data lines and connected to one of the bridge electrodes.

The plurality of auxiliary electrodes is positioned on the same layer as the plurality of data lines.

Some of the plurality of power lines include a first power line pattern and a second power line pattern, and the first power line pattern and the second power line pattern are connected to one of the bridge electrodes.

Contact areas between the power lines (each including the first power line pattern and the second power line pattern) and the bridge electrode have different sizes.

One of the contact areas between the corresponding power line and the corresponding bridge electrode is adjusted by increasing or decreasing a separation distance between the first power line pattern and the second power line pattern.

Each of the plurality of bridge electrodes includes a plurality of openings and a plurality of bridge portions.

The plurality of openings and the plurality of bridge portions intersect the plurality of data lines.

The plurality of openings and the plurality of bridge portions are spaced apart from the plurality of power lines.

The display device further includes a first buffer layer on the substrate, the bridge electrode on the first buffer layer, a second buffer layer on the bridge electrode, a gate insulating layer on the second buffer layer, an interlayer dielectric layer on the gate insulating layer, and the plurality of power lines on the interlayer dielectric layer. The plurality of power lines is connected to the bridge electrode through a bridge hole penetrating the second buffer layer, the gate insulating layer, and the interlayer dielectric layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. Names of the respective elements used in the following explanations are selected only for convenience of writing the specification and may be thus different from those used in actual products.

A display device according to an embodiment of the invention is a plastic display device, in which a display element is formed on a glass substrate. Examples of the plastic display device include an organic light emitting diode (OLED) display, a liquid crystal display (LCD), and an electrophoresis display. Embodiments are described using the OLED display by way of example. An OLED display includes an emission layer, which is formed of an organic material, between a first electrode serving as an anode and a second electrode serving as a cathode. The OLED display is a self-emission display device configured to form hole-electron pairs, i.e., excitons, by combining holes received from the first electrode and electrons received from the second electrode inside the emission layer and emit light by energy generated when the excitons return to a ground level. The OLED display according to the embodiment may alternatively use a plastic substrate rather than the glass substrate.

Embodiments of the invention are described below with reference to FIGS. 1 to 14.

Figure 1:
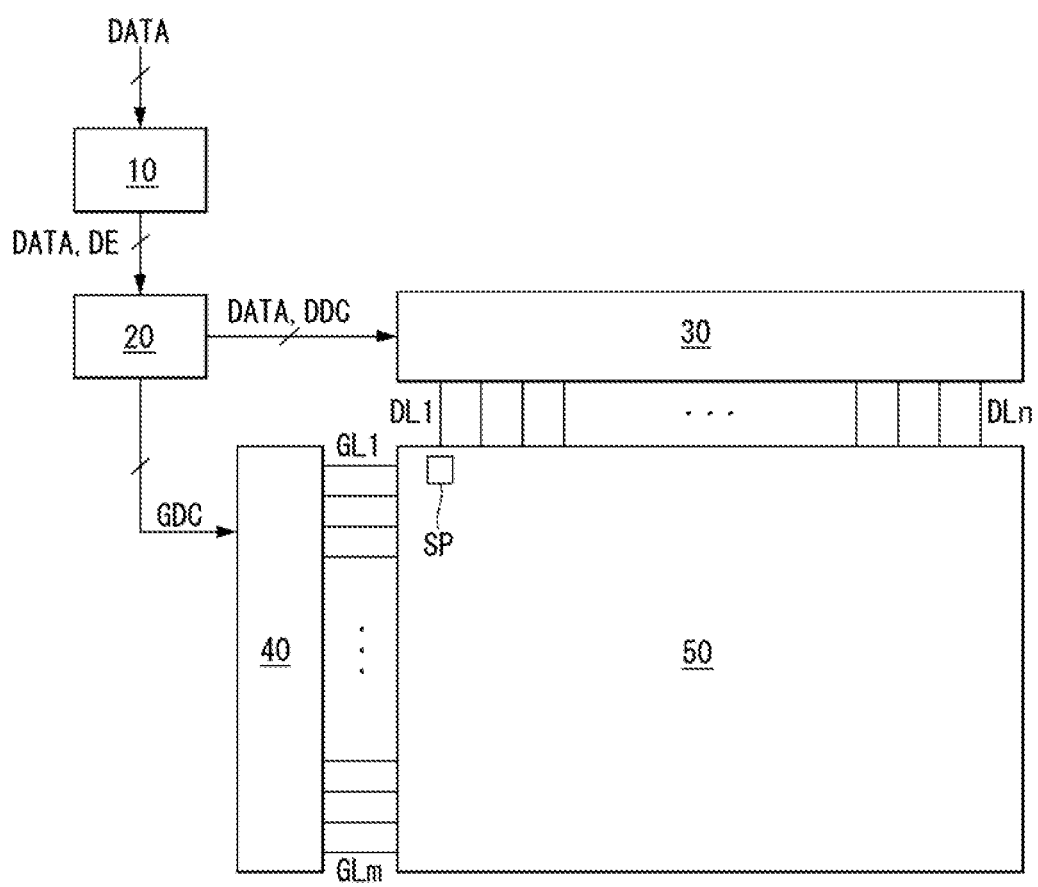
FIG. 1 is a schematic block diagram of an organic light emitting diode (OLED) display according to an embodiment of the invention.
Figure 2:
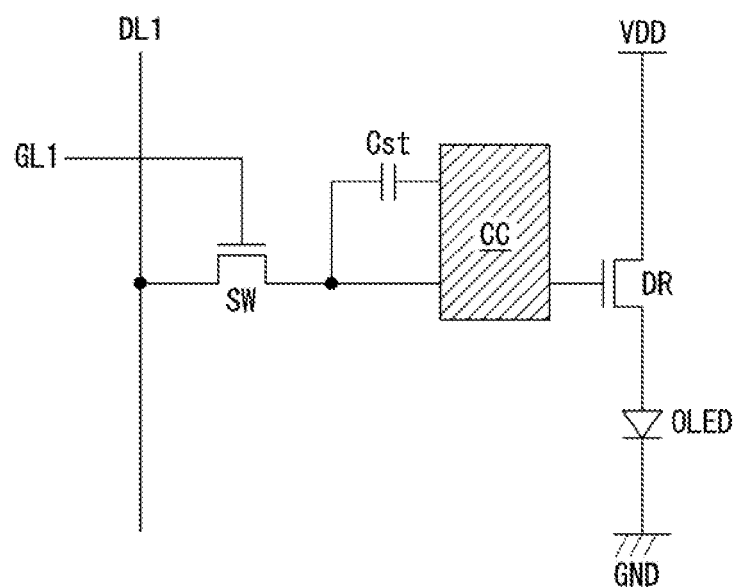
FIG. 2 illustrates a first example of a circuit configuration of a subpixel of the OLED display of FIG. 1.
Figure 3:
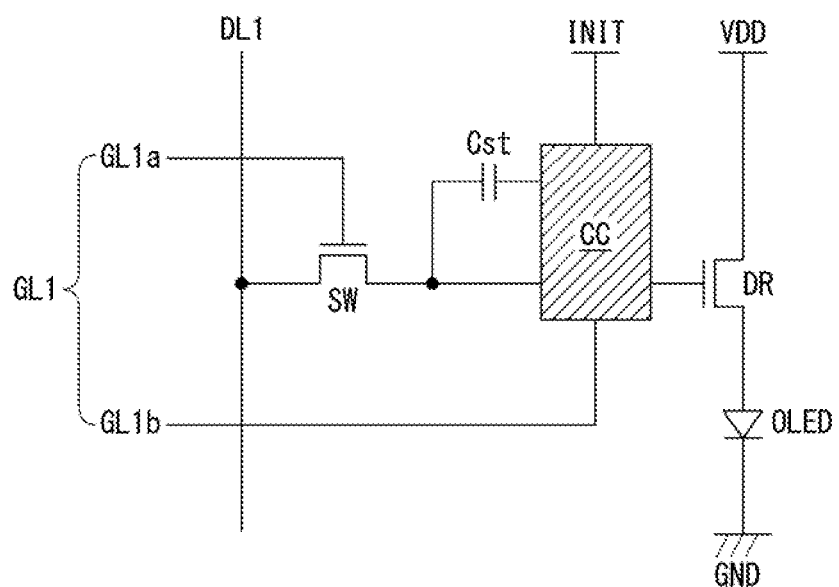
FIG. 3 illustrates a second example of a circuit configuration of a subpixel of the OLED display of FIG. 1.

FIG. 1 is a schematic block diagram of an OLED display according to an embodiment of the invention. FIG. 2 illustrates a first example of a circuit configuration of a subpixel of the OLED display of FIG. 1. FIG. 3 illustrates a second example of a circuit configuration of a subpixel of the OLED display of FIG. 1. All the components of the OLED display according to all embodiments of the invention are operatively coupled and configured.

Referring to FIG. 1, the OLED display according to an embodiment of the invention includes an image processing unit 10, a timing controller 20, a data driver 30, a gate driver 40, and a display panel 50.

The image processing unit 10 outputs a data signal DATA and a data enable signal DE supplied from the outside. The image processing unit 10 may output one or more of a vertical sync signal, a horizontal sync signal, and a clock signal in addition to the data enable signal DE. The image processing unit 10 may be formed on a system circuit board in an integrated circuit (IC) form.

The timing controller 20 receives the data signal DATA and driving signals including the data enable signal DE or the vertical sync signal, the horizontal sync signal, the clock signal, etc. from the image processing unit 10.

The timing controller 20 outputs a gate timing control signal GDC for controlling operation timing of the gate driver 40 and a data timing control signal DDC for controlling operation timing of the data driver 30 based on the driving signals. The timing controller 20 may be formed on a control circuit board in an IC form.

The data driver 30 samples and latches the data signal DATA received from the timing controller 20 in response to the data timing control signal DDC supplied from the timing controller 20 and converts the sampled and latched data signal DATA using gamma reference voltages. The data driver 30 outputs the converted data signal DATA to data lines DL1 to DLn. The data driver 30 is attached to a substrate as an IC.

The gate driver 40 outputs a gate signal while shifting a level of a gate voltage in response to the gate timing control signal GDC supplied from the timing controller 20. The gate driver 40 outputs the gate signal to gate lines GL1 to GLm. The gate driver 40 may be formed on a gate circuit board in an IC form, or may be formed on the display panel 50 in a gate-in panel (GIP) manner.

The display panel 50 displays an image in response to the data signal DATA and the gate signal respectively received from the data driver 30 and the gate driver 40. The display panel 50 includes subpixels SP displaying an image.

Referring to FIG. 2, each subpixel of the display panel 50 may include a switching transistor SW, a driving transistor DR, a compensation circuit CC, and an organic light emitting diode (OLED). The OLED operates to emit light based on a driving current generated by the driving transistor DR.

The switching transistor SW performs a switching operation so that a data signal supplied through a first data line DL1 is stored in a capacitor Cst as a data voltage in response to a gate signal supplied through a first gate line GL1. The driving transistor DR enables a driving current to flow between a high potential power line VDD and a low potential power line GND based on the data voltage stored in the capacitor Cst. The compensation circuit CC is a circuit for compensating for a threshold voltage of the driving transistor DR. The capacitor Cst connected to the switching transistor SW or the driving transistor DR may be mounted inside the compensation circuit CC.

The compensation circuit CC includes one or more thin film transistors (TFTs) and a capacitor. Configuration of the compensation circuit CC may be variously changed depending on a compensation method. A brief description of the compensation circuit CC according to another example as shown in FIG. 3 will be made.

As shown in FIG. 3, the subpixel including the compensation circuit CC may further include a signal line and a power line for driving a compensation TFT and supplying a predetermined signal or electric power. The added signal line may be defined as a 1-2 gate line GL1b for driving the compensation TFT included in the subpixel. In FIG. 3, "GL1a" is a 1-1 gate line for driving the switching transistor SW. The added power line may be defined as an initialization power line INIT for initializing a predetermined node of the subpixel at a predetermined voltage. However, embodiments are not limited thereto.

FIGS. 2 and 3 illustrate various examples of at least one subpixel that includes the compensation circuit CC. However, the compensation circuit CC may be omitted when an object (for example, the data driver 30) to be compensated is positioned outside the subpixel. The subpixel has a configuration of 2T(Transistor)1C(Capacitor) in which the switching transistor SW, the driving transistor DR, the capacitor, and the OLED are provided. However, when the compensation circuit CC is added to the subpixel, the subpixel may have various configurations such as 3T1C, 4T2C, 5T2C, 6T2C, 7T2C, and the like.

Also, FIGS. 2 and 3 illustrate that the compensation circuit CC is positioned between the switching transistor SW and the driving transistor DR by way of an example. However, the compensation circuit CC may be further positioned between the driving transistor DR and the OLED. The position and the structure of the compensation circuit CC are not limited to the ones illustrated in FIGS. 2 and 3.

Figure 4:
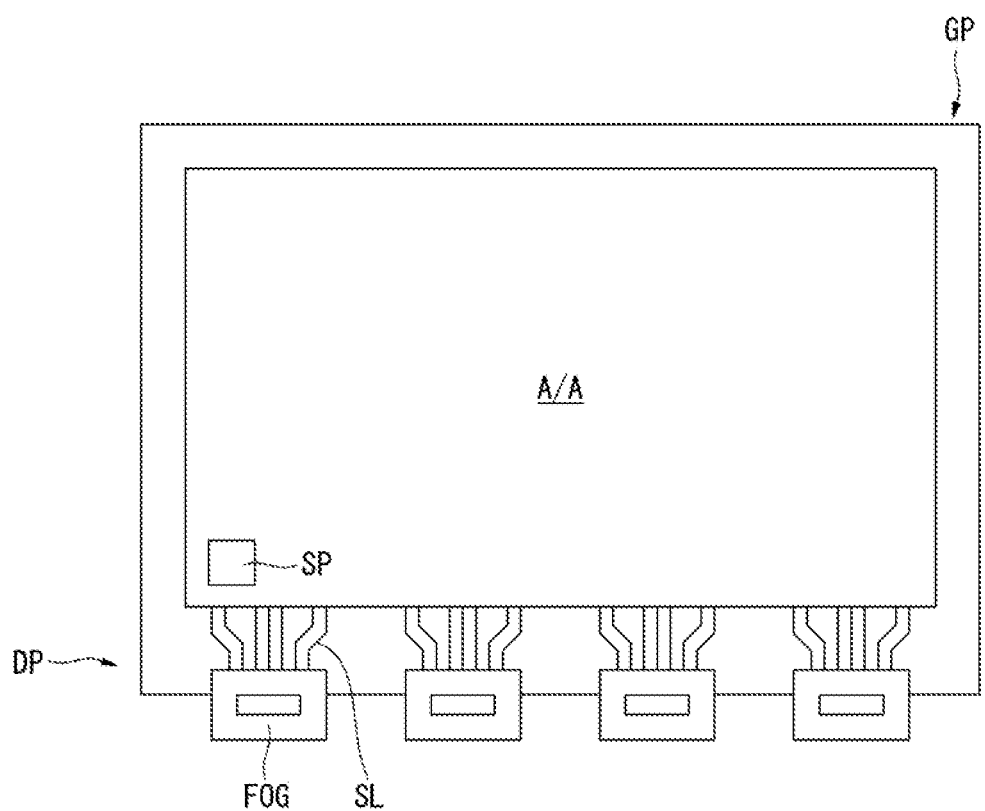
FIG. 4 is a plan view of an OLED display according to an embodiment of the invention.
Figure 5:
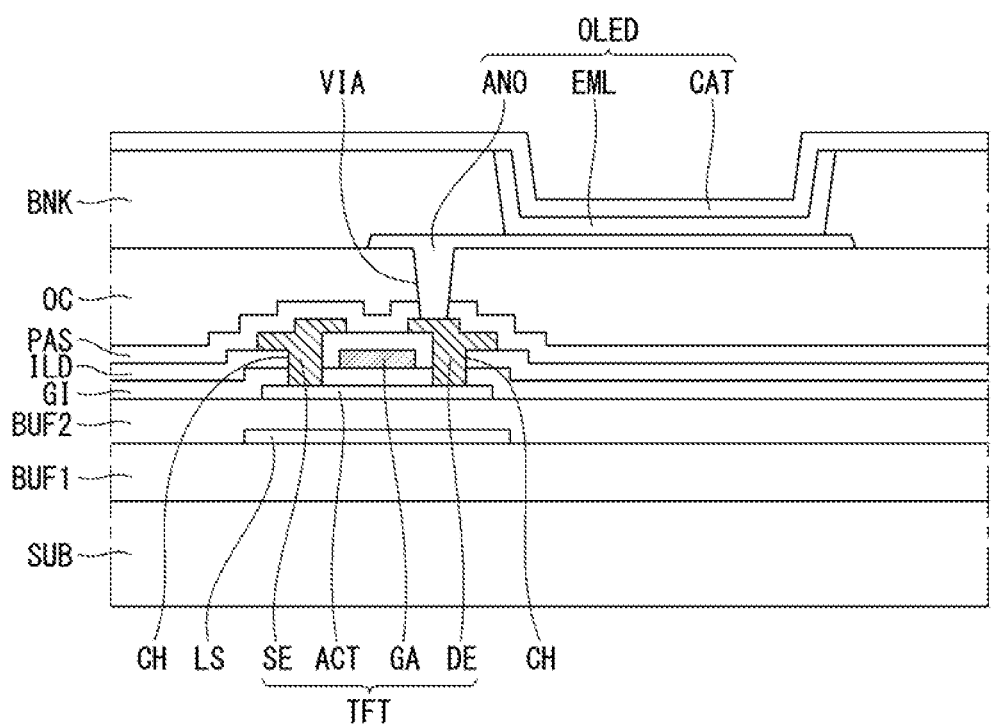
FIG. 5 is a cross-sectional view illustrating a subpixel of an OLED display according to an embodiment of the invention.

FIG. 4 is a plan view of an OLED display according to an embodiment of the invention. FIG. 5 is a cross-sectional view illustrating a subpixel of an OLED display according to an embodiment of the invention.

Referring to FIG. 4, the OLED display according to the embodiment of the invention includes a substrate, a display portion A/A, and a gate pad GP and a data pad DP surrounding the display portion A/A. The display portion A/A includes a plurality of subpixels SP, and red (R), green (G) and blue (B) subpixels SP or red (R), green (G), blue (B) and white (W) subpixels SP emit light to represent full color. The gate pad GP may be positioned on one side, for example, the right or left side of the display portion A/A and may be a gate-in panel (GIP) driver such that gate signal lines extended from the display portion A/A are connected to a plurality of thin film transistors. However, embodiments are not limited thereto. For example, the gate pad GP may be attached to a film-on-glass (FOG) in the same manner as the data pad DP which will be described below. The data pad DP may be positioned on one side, for example, the lower side of the display portion A/A, and a plurality of signal lines SL extended from the display portion A/A may be disposed on the data pad DP. The plurality of signal lines SL may include data lines and power lines, and may further include sensing lines. The plurality of signal lines SL may be supplied with a data signal and power electric through a FOG attached to the data pad DP.

A cross-sectional structure of a subpixel SP of an OLED display according to an embodiment of the invention is described below with reference to FIG. 5.

Referring to FIG. 5, in an OLED display according to an embodiment of the invention, a first buffer layer BUF1 is positioned on a substrate SUB. The substrate SUB may be made of glass. The first buffer layer BUF1 protects a thin film transistor formed in a subsequent process from impurities, for example, alkali ions discharged from the substrate SUB. The first buffer layer BUF1 may be a silicon oxide (SiOx) layer, a silicon nitride (SiNx) layer, or a multilayer thereof.

A shield layer LS is positioned on the first buffer layer BUF1. The shield layer LS blocks light incident from the outside and prevents a leakage current of the thin film transistor from being generated. A second buffer layer BUF2 is positioned on the shield layer LS. The second buffer layer BUF2 protects a thin film transistor formed in a subsequent process from impurities, for example, alkali ions discharged from the shield layer LS. The second buffer layer BUF2 may be a silicon oxide (SiOx) layer, a silicon nitride (SiNx) layer, or a multilayer thereof.

A semiconductor layer ACT is positioned on the second buffer layer BUF2 and may be formed of a silicon semiconductor or an oxide semiconductor. The silicon semiconductor may include amorphous silicon or crystallized polycrystalline silicon. The polycrystalline silicon has a high mobility (for example, more than 100 $cm^2/Vs$), low power consumption, and excellent reliability. Thus, the polycrystalline silicon can be applied to a gate driver and/or a multiplexer (MUX) for use in a driving element or applied to a driving TFT of each pixel of the OLED display. Because the oxide semiconductor has a low OFF-current, the oxide semiconductor is suitable for a switching TFT which has a short ON-time and a long OFF-time. Further, because the oxide semiconductor increases a voltage hold time of the pixel due to the low off-current, the oxide semiconductor is suitable for a display device requiring a low-speed drive and/or low power consumption. In addition, the semiconductor layer ACT includes a drain region and a source region each including p-type or n-type impurities, and also includes a channel region between the drain region and the source region.

A gate insulating layer GI is positioned on the semiconductor layer ACT and may be a silicon oxide (SiOx) layer, a silicon nitride (SiNx) layer, or a multilayer thereof. A gate electrode GA is positioned on the gate insulating layer GI at a location corresponding to a predetermined region (i.e., the channel region when impurities are injected) of the semiconductor layer ACT. The gate electrode GA may be formed of one of molybdenum (Mo), aluminum (Al), chrome (Cr), gold (Au), titanium (Ti), nickel (Ni), neodymium (Nd), copper (Cu), or a combination thereof. Further, the gate electrode GA may be a multilayer formed of one of molybdenum (Mo), aluminum (Al), chrome (Cr), gold (Au), titanium (Ti), nickel (Ni), neodymium (Nd), copper (Cu), or a combination thereof. For example, the gate electrode GA may be formed as a double layer of Mo/Al—Nd or Mo/Al.

An interlayer dielectric layer ILD is positioned on the gate electrode GA and insulates the gate electrode GA. The interlayer dielectric layer ILD may be a silicon oxide (SiOx) layer, a silicon nitride (SiNx) layer, or a multilayer thereof. Contact holes CH exposing a portion of the semiconductor layer ACT are formed in a portion of each of the interlayer dielectric layer ILD and the gate insulating layer GI.

A drain electrode DE and a source electrode SE are positioned on the interlayer dielectric layer ILD. The drain electrode DE is connected to the semiconductor layer ACT through the contact hole CH exposing the drain region of the semiconductor layer ACT, and the source electrode SE is connected to the semiconductor layer ACT through the contact hole CH exposing the source region of the semiconductor layer ACT. Each of the source electrode SE and the drain electrode DE may be formed as a single layer or as a multilayer. When each of the source electrode SE and the drain electrode DE is formed as the single layer, each of the source electrode SE and the drain electrode DE may be formed of one of molybdenum (Mo), aluminum (Al), chrome (Cr), gold (Au), titanium (Ti), nickel (Ni), neodymium (Nd), copper (Cu), or a combination thereof. When each of the source electrode SE and the drain electrode DE is formed as the multilayer, each of the source electrode SE and the drain electrode DE may be formed as a double layer of Mo/Al—Nd or as a triple layer of Ti/Al/Ti, Mo/Al/Mo or Mo/Al—Nd/Mo.

Thus, a thin film transistor TFT including the semiconductor layer ACT, the gate electrode GA, the source electrode SE, and the drain electrode DE is formed.

Further, a passivation layer PAS is positioned on the substrate SUB including the thin film transistor TFT. The passivation layer PAS is an insulating layer protecting the component underlying the passivation layer PAS and may be a silicon oxide (SiOx) layer, a silicon nitride (SiNx) layer, or a multilayer thereof. An overcoat layer OC is positioned on the passivation layer PAS. The overcoat layer OC may be a planarization layer for reducing a height difference of an underlying structure and may be formed of an organic material such as polyimide, benzocyclobutene-based resin, and acrylate. For example, the overcoat layer OC may be formed through a spin-on glass (SOG) method for coating the organic material in a liquid state and then curing the organic material.

A via hole VIA exposing the drain electrode DE of the thin film transistor TFT is positioned in a portion of the overcoat layer OC. An organic light emitting diode OLED is positioned on the overcoat layer OC. More specifically, a first electrode ANO is positioned on the overcoat layer OC. The first electrode ANO serves as a pixel electrode and is connected to the drain electrode DE of the thin film transistor TFT through the via hole VIA. The first electrode ANO is an anode and may be formed of a transparent conductive material such as indium tin oxide (ITO), indium zinc oxide (IZO), and zinc oxide (ZnO). When the first electrode ANO is a reflective electrode, the first electrode ANO may further include a reflective layer. The reflective layer may be formed of aluminum (Al), copper (Cu), silver (Ag), nickel (Ni), palladium (Pd) or a combination thereof. For example, the reflective layer may be formed of an Ag/Pd/Cu (APC) alloy.

In addition, a bank layer BNK defining pixels is positioned on the substrate SUB including the first electrode ANO. The bank layer BNK may be formed of an organic material such as polyimide, benzocyclobutene-based resin, and acrylate. The bank layer BNK includes a pixel definition portion exposing the first electrode ANO. An emission layer EML contacting the first electrode ANO is positioned in the pixel definition portion of the bank layer BNK. The emission layer EML is a layer, in which electrons and holes combine and emit light. A hole injection layer and/or a hole transport layer may be positioned between the emission layer EML and the first electrode ANO, and an electron injection layer and/or an electron transport layer may be positioned on the emission layer EML.

A second electrode CAT is positioned on the emission layer EML and may be positioned on an entire surface of the display portion A/A (see FIG. 4) of the substrate SUB. In addition, the second electrode CAT is a cathode electrode and may be formed of magnesium (Mg), calcium (Ca), aluminum (Al), silver (Ag), or a combination thereof each having a low work function. When the second electrode CAT is a transmissive electrode, the second electrode CAT may be thin enough to transmit light. Further, when the second electrode CAT is a reflective electrode, the second electrode CAT may be thick enough to reflect light.

The data pad of the OLED displays according to the embodiments of the invention is described in detail below. These data pad configurations, which will be discussed below, are applicable to any of the OLED display devices and other types of display devices discussed according to the various embodiments of the invention.

First Embodiment

Figure 6:
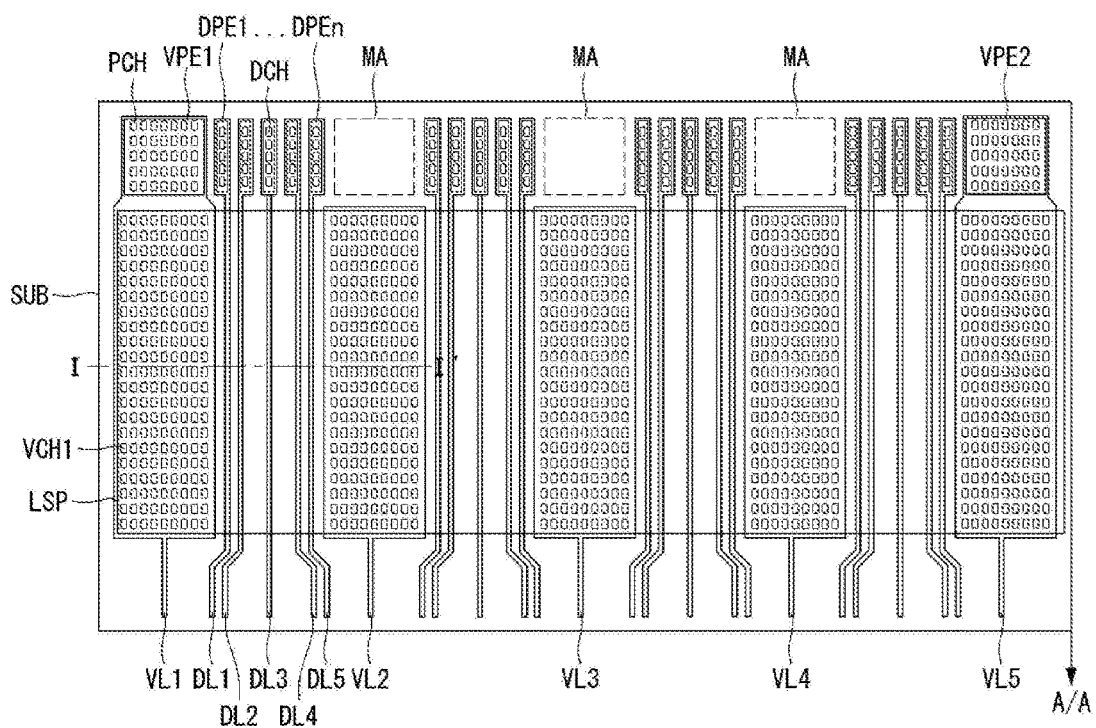
FIG. 6 is an enlarged plan view of a data pad according to a first embodiment of the invention.
Figure 7:
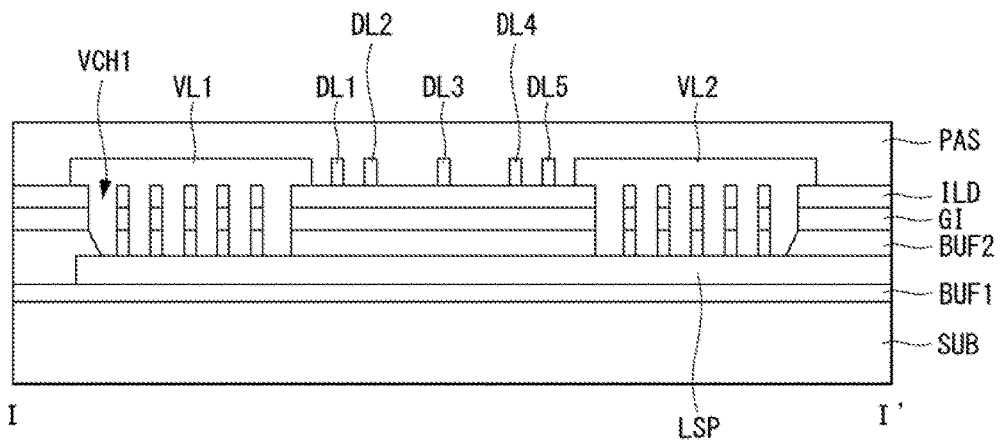
FIG. 7 is a cross-sectional view taken along line I-I' of FIG. 6.

FIG. 6 is an enlarged plan view of a data pad according to a first embodiment of the invention, and FIG. 7 is a cross-sectional view taken along line I-I' of FIG. 6.

Referring to FIG. 6, a plurality of power lines VL1, VL2, VL3, VL4 and VL5 extended from a display portion A/A on a substrate SUB is disposed on a data pad. Further, power pad electrodes VPE1 and VPE2 are disposed to be respectively connected to ends of some (for example, VL1 and VL5) of the plurality of power lines VL1, VL2, VL3, VL4 and VL5 through pad holes PCH. A plurality of data lines DL1, DL2, DL3, DL4, and DL5 to DLn extended from the display portion A/A is disposed between the plurality of power lines VL1, VL2, VL3, VL4 and VL5. Further, data pad electrodes DPE1 to DPEn are disposed to be respectively connected to ends of the plurality of data lines DL1, DL2, DL3, DL4, and DL5 to DLn through data holes DCH. The plurality of power lines VL1, VL2, VL3, VL4 and VL5 contacts and is connected to a bridge electrode LSP intersecting the plurality of power lines VL1, VL2, VL3, VL4 and VL5.

More specifically, referring to FIG. 7, a first buffer layer BUF1 is positioned on the substrate SUB, and the bridge electrode LSP is positioned on the first buffer layer BUF1. The bridge electrode LSP is positioned on the same layer as a shield layer included in a subpixel and is configured in the same manner as the shield layer. A second buffer layer BUF2 is positioned on the bridge electrode LSP. The second buffer layer BUF2 includes a plurality of holes and exposes the bridge electrode LSP. A gate insulating layer GI is positioned on the second buffer layer BUF2. The gate insulating layer GI includes a plurality of holes and exposes the bridge electrode LSP exposed by the second buffer layer BUF2. An interlayer dielectric layer ILD is positioned on the gate insulating layer GI. The interlayer dielectric layer ILD includes a plurality of holes and exposes the bridge electrode LSP exposed by the second buffer layer BUF2 and the gate insulating layer GI. The holes, which are included in the second buffer layer BUF2, the gate insulating layer GI, and the interlayer dielectric layer ILD and expose the bridge electrode LSP, include bridge holes VCH1.

The plurality of power lines VL1 and VL2 and the plurality of data lines DL1, DL2, DL3, DL4, and DL5 are positioned on the interlayer dielectric layer ILD. The power lines VL1 and VL2 contact and are electrically connected to the bridge electrode LSP through the bridge holes VCH1. In the embodiment, the second buffer layer BUF2, the gate insulating layer GI, and the interlayer dielectric layer ILD are formed between the bridge electrode LSP and the data lines DL1, DL2, DL3, DL4, and DL5 so as to prevent a short circuit between the bridge electrode LSP and the data lines DL1, DL2, DL3, DL4, and DL5, thereby securing a margin.

A passivation layer PAS is positioned on the plurality of power lines VL1 and VL2 and the plurality of data lines DL1, DL2, DL3, DL4, and DL5, and thus a data pad DP is configured. FIG. 7 illustrates a cross-sectional configuration corresponding to the two power lines VL1 and VL2 among the five power lines VL1, VL2, VL3, VL4 and VL5 shown in FIG. 6, by way of example. Other power lines VL3, VL4 and VL5 are connected to the bridge electrode LSP.

Referring again to FIG. 6, the first embodiment is configured such that the five power lines VL1, VL2, VL3, VL4 and VL5 of the data pad are connected to one bridge electrode LSP, and the two power lines VL1 and VL5 at both ends among the five power lines VL1, VL2, VL3, VL4 and VL5 include the power pad electrodes VPE1 and VPE2, respectively. Namely, all the five power lines VL1, VL2, VL3, VL4 and VL5 do not include individually the power pad electrodes, and only the two power lines at both ends include the power pad electrodes, respectively. As a result, the number of power pad electrodes can decrease from five to two. In other words, the first embodiment is configured such that the power lines include the power pad electrodes less than the number of power lines without respectively including the power pad electrodes. Thus, a pitch of the power pad electrodes or a pitch of the data pad electrodes can increase by an area MA obtained by a reduction in the number of power pad electrodes.

So far, the first embodiment described that the five power lines VL1, VL2, VL3, VL4 and VL5 are connected to one bridge electrode LSP, and the two power lines VL1 and VL5 at both ends include the power pad electrodes VPE1 and VPE2, respectively. However, FIG. 6 illustrates only a portion of the first embodiment, by way of example. Also one bridge electrode is connected to every five power lines. Further, the first embodiment described that one bridge electrode is connected to every five power lines, but is not limited thereto. For example, one bridge electrode may be connected to every two or more power lines. The plurality of power lines connected to one bridge electrode may include one or more power pad electrodes.

Second Embodiment

Figure 8:
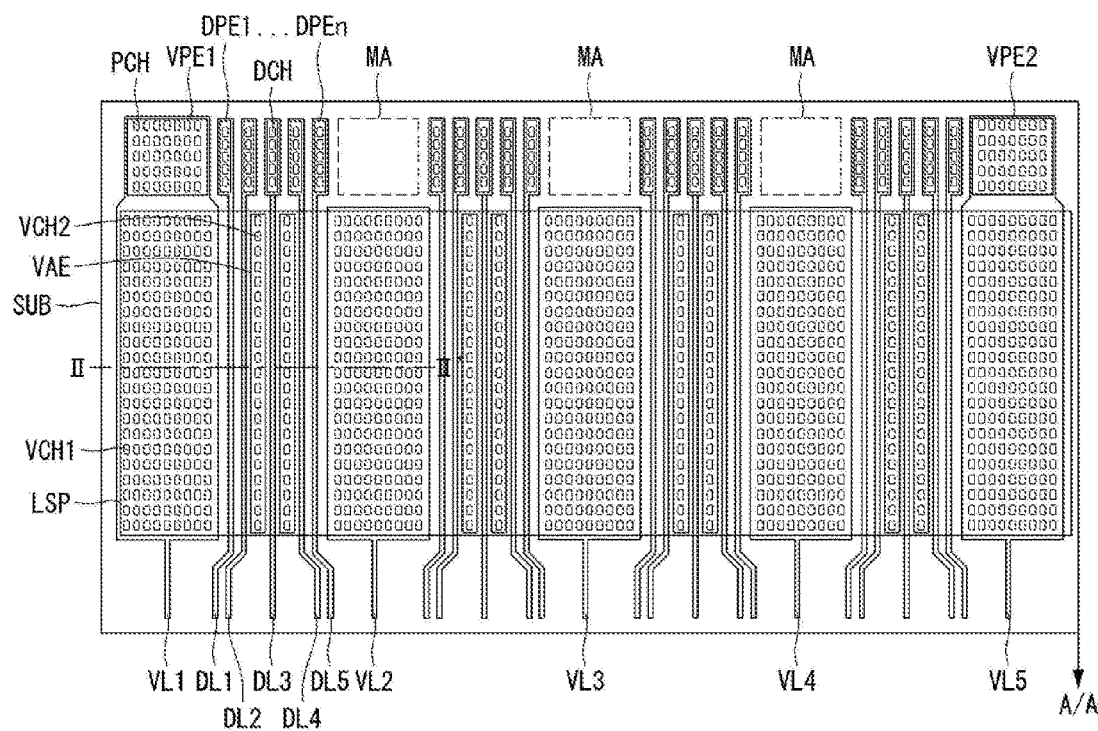
FIG. 8 is an enlarged plan view of a data pad according to a second embodiment of the invention.
Figure 9:
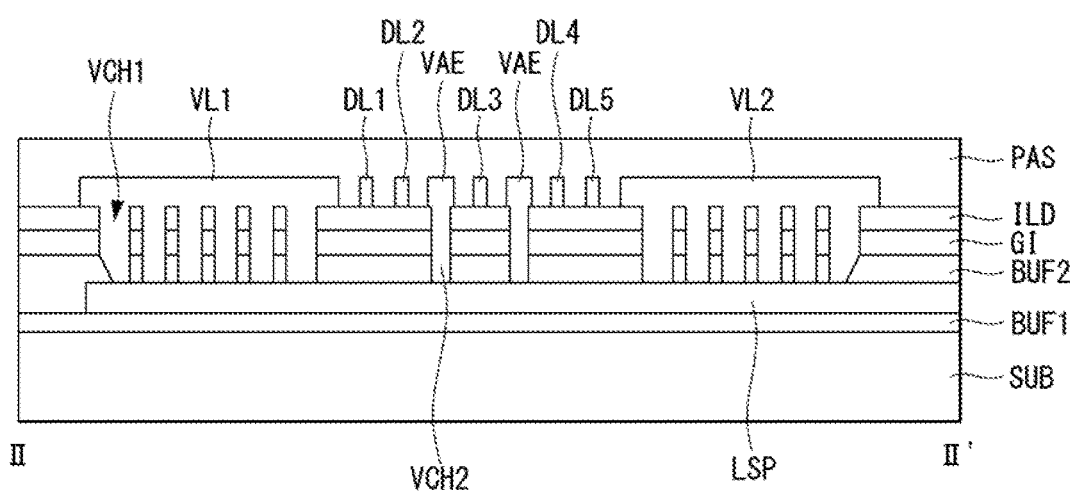
FIG. 9 is a cross-sectional view taken along line II-II' of FIG. 8.

FIG. 8 is an enlarged plan view of a data pad according to a second embodiment of the invention. FIG. 9 is a cross-sectional view taken along line II-II' of FIG. 8.

Referring to FIG. 8, a plurality of power lines VL1, VL2, VL3, VL4 and VL5 extended from a display portion A/A on a substrate SUB is disposed on a data pad. Further, power pad electrodes VPE1 and VPE2 are disposed to be respectively connected to ends of some (for example, VL1 and VL5) of the plurality of power lines VL1, VL2, VL3, VL4 and VL5 through pad holes PCH. A plurality of data lines DL1, DL2, DL3, DL4, and DL5 to DLn extended from the display portion A/A is disposed between the plurality of power lines VL1, VL2, VL3, VL4 and VL5. Further, data pad electrodes DPE1 to DPEn are disposed to be respectively connected to ends of the plurality of data lines DL1, DL2, DL3, DL4, and DL5 to DLn through data holes DCH.

The plurality of power lines VL1, VL2, VL3, VL4 and VL5 contacts and is connected to a bridge electrode LSP intersecting the plurality of power lines VL1, VL2, VL3, VL4 and VL5. In the second embodiment, auxiliary electrodes VAE are additionally disposed every between some (for example, DL2, DL3 and DL4) of the plurality of data lines DL1, DL2, DL3, DL4, and DL5 to DLn.

More specifically, referring to FIG. 9, a first buffer layer BUF1 is positioned on the substrate SUB, and the bridge electrode LSP is positioned on the first buffer layer BUF1. The bridge electrode LSP is positioned on the same layer as a shield layer included in a subpixel and is configured in the same manner as the shield layer. A second buffer layer BUF2 is positioned on the bridge electrode LSP. The second buffer layer BUF2 includes a plurality of holes and exposes the bridge electrode LSP. A gate insulating layer GI is positioned on the second buffer layer BUF2. The gate insulating layer GI includes a plurality of holes and exposes the bridge electrode LSP exposed by the second buffer layer BUF2. An interlayer dielectric layer ILD is positioned on the gate insulating layer GI. The interlayer dielectric layer ILD includes a plurality of holes and exposes the bridge electrode LSP exposed by the second buffer layer BUF2 and the gate insulating layer GI. The holes, which are included in the second buffer layer BUF2, the gate insulating layer GI, and the interlayer dielectric layer ILD and expose the bridge electrode LSP, include bridge holes VCH1 and auxiliary holes VCH2.

The plurality of power lines VL1 and VL2, the plurality of data lines DL1, DL2, DL3, DL4, and DL5, and the auxiliary electrodes VAE are positioned on the interlayer dielectric layer ILD. The power lines VL1 and VL2 contact and are electrically connected to the bridge electrode LSP through the bridge holes VCH1. The auxiliary electrodes VAE contact and are electrically connected to the bridge electrode LSP through the auxiliary holes VCH2. The auxiliary electrodes VAE are positioned on the same layer as the plurality of power lines VL1 and VL2 and the plurality of data lines DL1, DL2, DL3, DL4, and DL5. A passivation layer PAS is positioned on the plurality of power lines VL1 and VL2, the plurality of data lines DL1, DL2, DL3, DL4, and DL5, and the auxiliary electrodes VAE, and thus a data pad DP is configured.

Referring again to FIG. 8, in the second embodiment, a voltage from the first power line VL1 positioned on a leftmost side of the data pad and the fifth power line VL5 positioned on a rightmost side of the data pad is applied to the bridge electrode LSP. Therefore, as the bridge electrode LSP goes toward the third power line VL3 positioned in the middle of the data pad, a magnitude of the voltage of the bridge electrode LSP is reduced. Thus, the second embodiment further includes the auxiliary electrodes VAE electrically connected to the bridge electrode LSP and can prevent a reduction in the voltage of the bridge electrode LSP.

Third Embodiment

Figure 10:
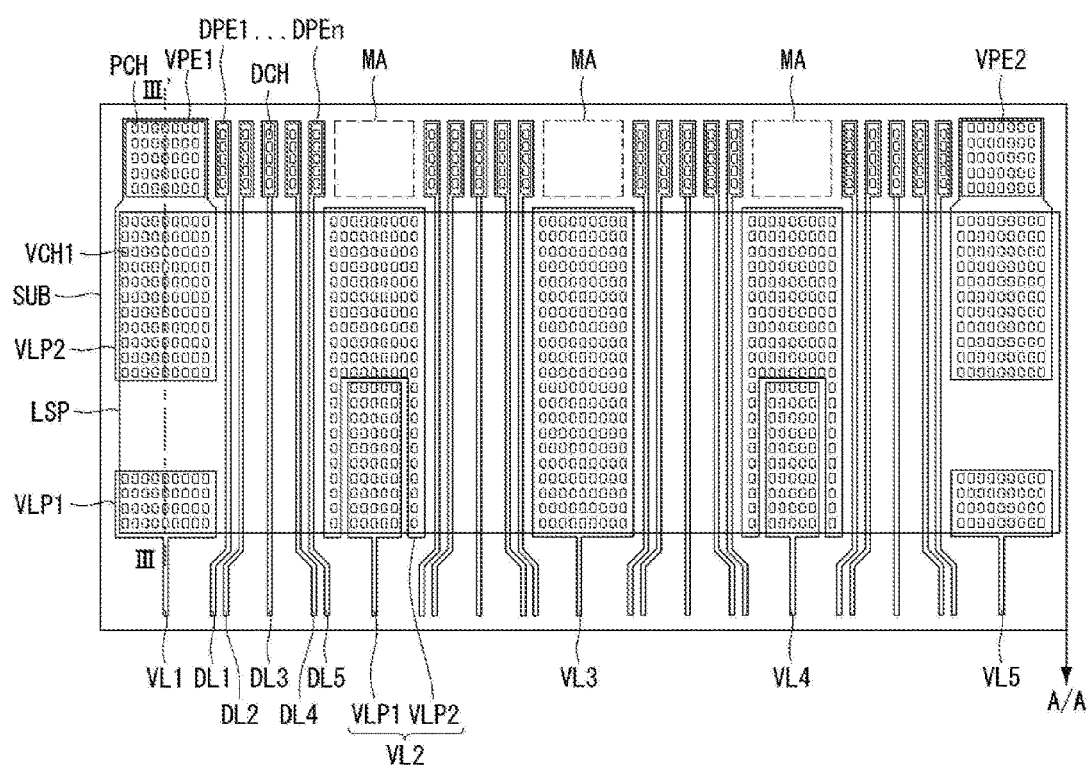
FIG. 10 is a plan view of a data pad according to a third embodiment of the invention.
Figure 11:
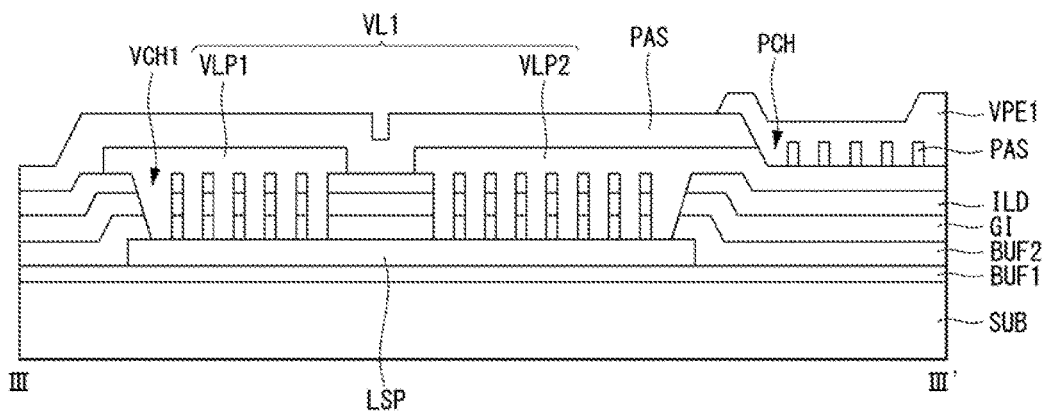
FIG. 11 is a cross-sectional view taken along line III-III' of FIG. 10.

FIG. 10 is a plan view of a data pad according to a third embodiment of the invention. FIG. 11 is a cross-sectional view taken along line III-III' of FIG. 10.

Referring to FIG. 10, a plurality of power lines VL1, VL2, VL3, VL4 and VL5 extended from a display portion A/A on a substrate SUB is disposed on a data pad. Further, power pad electrodes VPE1 and VPE2 are disposed to be respectively connected to ends of some (for example, VL1 and VL5) of the plurality of power lines VL1, VL2, VL3, VL4 and VL5 through pad holes PCH. A plurality of data lines DL1, DL2, DL3, DL4, and DL5 to DLn extended from the display portion A/A is disposed between the plurality of power lines VL1, VL2, VL3, VL4 and VL5. Further, data pad electrodes DPE1 to DPEn are disposed to be respectively connected to ends of the plurality of data lines DL1, DL2, DL3, DL4, and DL5 to DLn through data holes DCH.

The plurality of power lines VL1, VL2, VL3, VL4 and VL5 contacts and is connected to a bridge electrode LSP intersecting the plurality of power lines VL1, VL2, VL3, VL4 and VL5. In the third embodiment, some (for example, VL1, VL2, VL4 and VL5) of the plurality of power lines VL1, VL2, VL3, VL4 and VL5 each have two or more patterns.

More specifically, referring to FIG. 11, a first buffer layer BUF1 is positioned on the substrate SUB, and the bridge electrode LSP is positioned on the first buffer layer BUF1. A second buffer layer BUF2 is positioned on the bridge electrode LSP. The second buffer layer BUF2 includes a plurality of holes and exposes the bridge electrode LSP. A gate insulating layer GI is positioned on the second buffer layer BUF2. The gate insulating layer GI includes a plurality of holes and exposes the bridge electrode LSP exposed by the second buffer layer BUF2. An interlayer dielectric layer ILD is positioned on the gate insulating layer GI. The interlayer dielectric layer ILD includes a plurality of holes and exposes the bridge electrode LSP exposed by the second buffer layer BUF2 and the gate insulating layer GI. The holes, which are included in the second buffer layer BUF2, the gate insulating layer GI, and the interlayer dielectric layer ILD and expose the bridge electrode LSP, include bridge holes VCH1.

A first power line pattern VLP1 and a second power line pattern VLP2 of the power line VL1 are positioned on the interlayer dielectric layer ILD. The first power line pattern VLP1 and the second power line pattern VLP2 contact and are electrically connected to the bridge electrode LSP through the bridge hole VCH1. A passivation layer PAS is disposed on the power line VL1 and includes a pad hole PCH exposing the second power line pattern VLP2 of the power line VL1. The power pad electrode VPE is positioned on the pad hole PCH and connected to the second power line pattern VLP2 of the power line VL1.

Referring to FIGS. 10 and 11, the first power line VL1 includes a first power line pattern VLP1 positioned adjacent to the display portion A/A and a second power line pattern VLP2 positioned adjacent to the power pad electrode VPE1. Because the first power line pattern VLP1 and the second power line pattern VLP2 are connected to the bridge electrode LSP positioned below, the first power line pattern VLP1 and the second power line pattern VLP2 are electrically connected to each other even if they are spaced apart from each other. A separation distance between the first power line pattern VLP1 and the second power line pattern VLP2 is adjusted to reduce a contact area between the bridge electrode LSP and the first power line pattern VLP1. Hence, an output voltage of the first power line VL1 can be controlled.

Further, the second power line VL2 includes a first power line pattern VLP1 forming one body together with the display portion A/A and a second power line pattern VLP2 adjacent to an end of the substrate SUB. Because the first power line pattern VLP1 and the second power line pattern VLP2 are connected to the bridge electrode LSP positioned below, the first power line pattern VLP1 and the second power line pattern VLP2 are electrically connected to each other even if they are spaced apart from each other. A separation distance between the first power line pattern VLP1 and the second power line pattern VLP2 is adjusted to reduce a contact area between the bridge electrode LSP and the first power line pattern VLP1. Hence, an output voltage of the second power line VL2 can be controlled.

As described above, a voltage from the first power line VL1 positioned on a leftmost side of the data pad and the fifth power line VL5 positioned on a rightmost side of the data pad is applied to the bridge electrode LSP. Therefore, as the bridge electrode LSP goes toward the third power line VL3 positioned in the middle of the data pad, a magnitude of the voltage of the bridge electrode LSP is reduced. Thus, the third embodiment is configured such that the first power line VL1 and the fifth power line VL5 supplied with electric power each have a maximum resistance, and a resistance gradually decreases as the bridge electrode LSP goes toward the third power line VL3. To this end, in each of the first power line VL1 and the fifth power line VL5 supplied with electric power, a separation distance between the first power line pattern VLP1 and the second power line pattern VLP2 is set to a maximum value. Hence, a contact area between the first and second power line patterns VLP1 and VLP2 and the bridge electrode LSP decreases, and resistances of the first power line VL1 and the fifth power line VL5 increase. In each of the second power line VL2 and the fourth power line VL4, a separation distance between the first power line pattern VLP1 and the second power line pattern VLP2 is set to be relatively less than that in the first power line VL1 and the fifth power line VL5. Hence, a contact area between the first and second power line patterns VLP1 and VLP2 and the bridge electrode LSP is relatively larger than that in the first power line VL1 and the fifth power line VL5, and resistances of the second power line VL2 and the fourth power line VL4 are reduced. The third power line VL3 positioned in the middle does not have the first and second power line patterns VLP1 and VLP2, as described above. Hence, a contact area between the third power line VL3 and the bridge electrode LSP is larger than the other power lines VL1, VL2, VL4 and VL5, and a resistance of the third power line VL3 has a minimum value. Namely, the contact area between the power line and the bride electrode LSP can be adjusted by increasing or decreasing the separation distance between the first power line pattern VLP1 and the second power line pattern VLP2. Thus, as the bride electrode LSP goes from the first power line VL1 at the leftmost side supplied with the voltage and the fifth power line VL5 at the rightmost side supplied with the voltage to the third power line VL3, the contact area between the power line and the bride electrode LSP can increase. Hence, the resistance can decrease.

In the third embodiment, an output voltage of the first power line VL1 at the leftmost side supplied with the voltage and an output voltage of the fifth power line VL5 at the rightmost side supplied with the voltage can be adjusted similarly to output voltages of the second, third, and fourth power lines VL2, VL3 and VL4. Therefore, there is an advantage that an emission luminance of each subpixel of the display portion A/A can be uniformly controlled.

Fourth Embodiment

Figure 12:
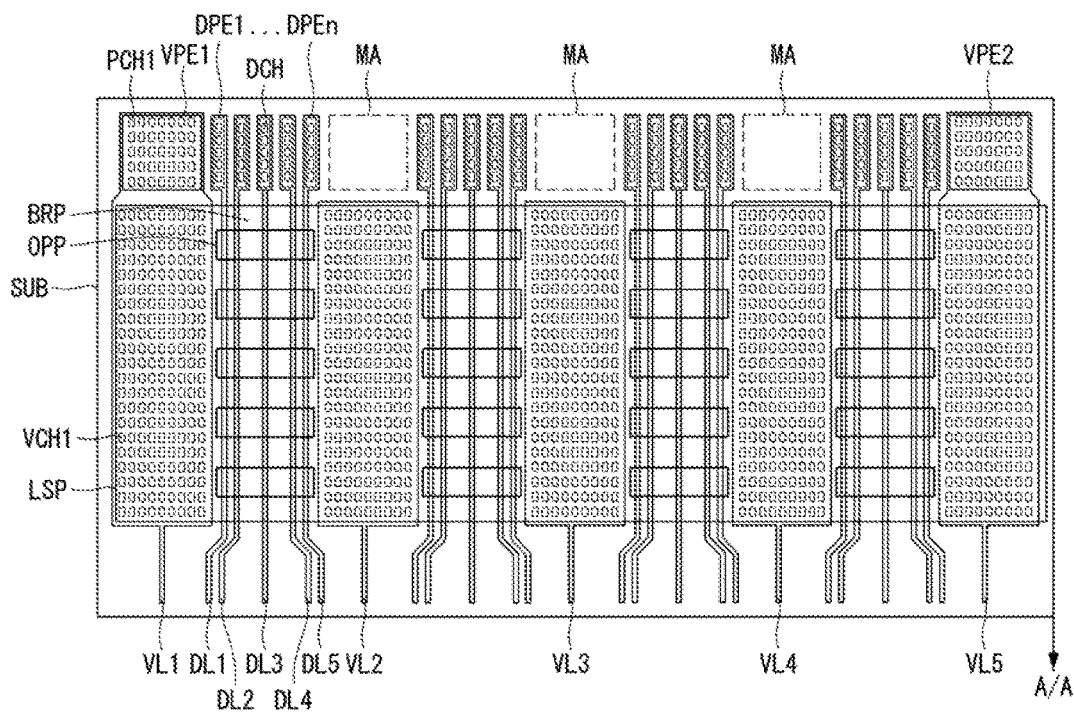
FIG. 12 is a plan view of a data pad according to a fourth embodiment of the invention.

FIG. 12 is a plan view of a data pad according to a fourth embodiment of the invention.

Referring to FIG. 12, a plurality of power lines VL1, VL2, VL3, VL4 and VL5 extended from a display portion A/A on a substrate SUB is disposed on a data pad. Further, power pad electrodes VPE1 and VPE2 are disposed to be respectively connected to ends of some (for example, VL1 and VL5) of the plurality of power lines VL1, VL2, VL3, VL4 and VL5 through pad holes PCH. A plurality of data lines DL1, DL2, DL3, DL4, and DL5 to DLn extended from the display portion A/A is disposed between the plurality of power lines VL1, VL2, VL3, VL4 and VL5. Further, data pad electrodes DPE1 to DPEn are disposed to be respectively connected to ends of the plurality of data lines DL1, DL2, DL3, DL4, and DL5 to DLn through data holes DCH.

The plurality of power lines VL1, VL2, VL3, VL4 and VL5 contacts and is connected to a bridge electrode LSP intersecting the plurality of power lines VL1, VL2, VL3, VL4 and VL5. In the fourth embodiment, the bridge electrode LSP includes a plurality of openings OPP and a plurality of bridge portions BRP.

More specifically, the plurality of openings OPP and the plurality of bridge portions BRP are positioned at intersections of the bridge electrode LSP and the plurality of data lines DL1 to DLn. The plurality of openings OPP and the plurality of bridge portions BRP are disposed in a direction vertically intersecting the plurality of data lines DL1 to DLn. The plurality of openings OPP and the plurality of bridge portions BRP are disposed to be spaced apart from the plurality of power lines VL1, VL2, VL3, VL4 and VL5. The plurality of openings OPP and the plurality of bridge portions BRP included in the bridge electrode LSP are used to repair a short circuit when the short circuit between the bridge electrode LSP and the data lines DL1 to DLn is generated. For example, when a short circuit between one of the data lines DL1 to DLn and the bridge electrode LSP is generated between the first power line VL1 and the second power line VL2, a power voltage of the bridge electrode LSP is not supplied to other power lines due to the short circuit. Thus, in the fourth embodiment, when a short circuit between one data line and the bridge electrode LSP is generated, the bridge portion BRP corresponding to the short circuit is cut by a laser, thereby removing the short circuit. Hence, the power voltage of the bridge electrode LSP is transferred to another bridge portion BRP. As a result, the fourth embodiment can improve the reliability of the bridge electrode LSP and prevent a defective drive resulting from the short circuit through the openings OPP and the bridge portions BRP included in the bridge electrode LSP.

So far, the first to fourth embodiments of the invention illustrated and described the various structures of the data pad. However, the first to fourth embodiments of the invention may be individually described or may be combined in various ways. For example, the structure of the power lines of the third embodiment may be combined with the structure of the second embodiment, or the structure of the bridge electrode of the third embodiment may be combined with the structure of the second embodiment.

Figure 13:
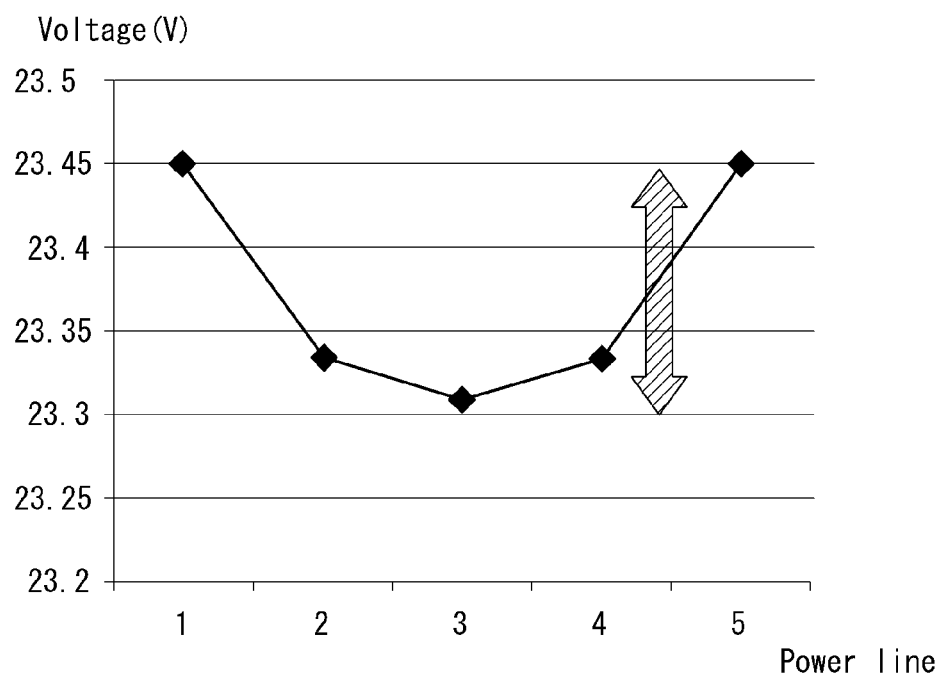
FIG. 13 is a graph illustrating voltages of power lines based on a structure of a data pad according to the first embodiment of the invention.
Figure 14:
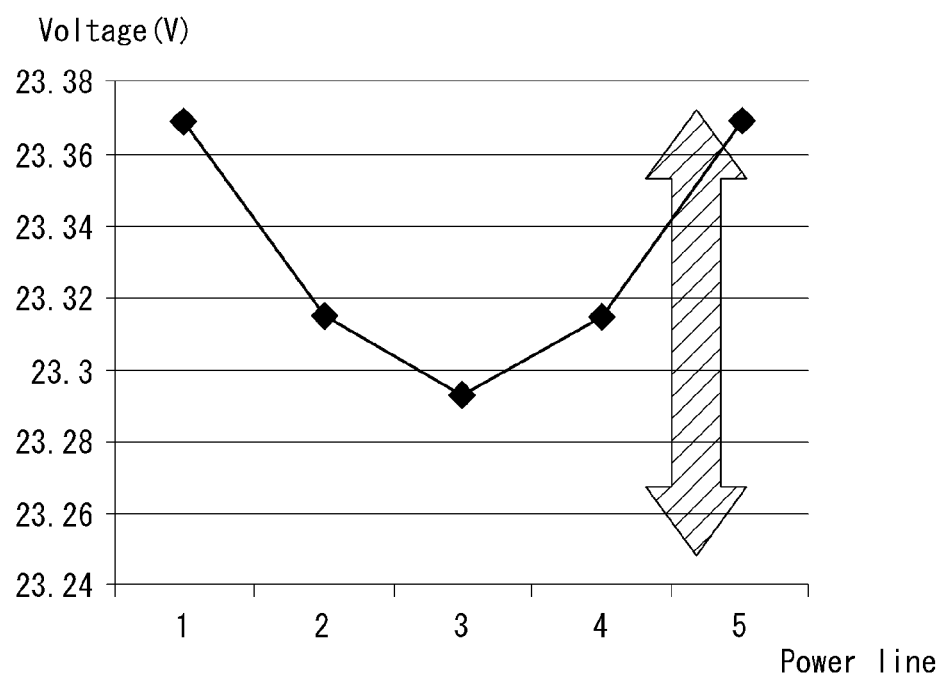
FIG. 14 is a graph illustrating voltages of power lines based on a structure of a data pad according to the third embodiment of the invention.

FIG. 13 illustrates voltages of the power lines in the structure of the data pad according to the first embodiment of the invention shown in FIG. 6. FIG. 14 illustrates voltages of the power lines in the structure of the data pad according to the third embodiment of the invention shown in FIG. 10.

FIGS. 13 and 14 illustrate a simulation result for verifying an effect of reducing a voltage difference between the power lines through the effect of the third embodiment of the invention. As shown in FIG. 13, voltages of first and fifth power lines supplied with the power voltage were measured as 23.45V, and voltages of second, third, and fourth power lines, to which the power voltage was transferred through the bridge electrode, were gradually reduced and were measured as a minimum voltage of 23.3V. Namely, a difference between the maximum voltage of 23.45V and the minimum voltage of 23.3V in the plurality of power lines was 0.15V. On the other hand, as shown in FIG. 14, voltages of first and fifth power lines supplied with the power voltage were measured as 23.37V, and voltages of second, third, and fourth power lines, to which the power voltage was transferred through the bridge electrode, were gradually reduced and were measured as a minimum voltage of 23.29V. Namely, a difference between the maximum voltage of 23.37V and the minimum voltage of 23.29V in the plurality of power lines was 0.07V.

From the above result, the output voltages of the power lines can be uniformly obtained by adjusting resistances of the power lines in the structure of the data pad according to the third embodiment of the invention.

As described above, the display device according the embodiments of the invention includes the power pad electrodes less than the number of power lines using the bridge electrode and thus can increase the pitch of the power pad electrodes or the pitch of the data pad electrodes by an area obtained due to a reduction in the number of power pad electrodes. Hence, the embodiments of the invention can prevent the short circuit resulting from the small pitch between the pad electrodes. Further, the embodiments of the invention can prevent the short circuit between the bridge electrode and the data lines by forming the plurality of insulating layers between the bridge electrode and the data lines.

Further, the display device according the embodiments of the invention can prevent a reduction in the voltage transferred through the bridge electrode by forming the auxiliary electrodes. The embodiments of the invention can reduce a difference in the output voltage between the power line supplied with the voltage and the power line not supplied with the voltage by adjusting the contact area between the power line and the bridge electrode. The embodiments of the invention can repair the short circuit through the bridge portions included in the bridge electrode even if the short circuit between the bridge electrode and the data line is generated. As a result, the display device according the embodiments of the invention can prevent the defective drive resulting from the short circuit and improve the reliability.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a substrate including a display portion and a pad portion outside the display portion;
   a first buffer layer on the substrate;
   one of a plurality of bridge electrodes on the first buffer layer;
   a second buffer layer on the one of the plurality of bridge electrodes;
   a gate insulating layer on the second buffer layer;
   an interlayer dielectric layer on the gate insulating layer;
   a plurality of power lines positioned on the interlayer dielectric layer of the pad portion of the substrate and extended from the display portion; and
   a plurality of data lines positioned in parallel with the plurality of power lines and extended from the display portion,
   wherein the plurality of bridge electrodes is configured to connect at least two of the plurality of power lines,
   wherein some of the plurality of power lines include a power pad electrode on at least an end of the corresponding power line,
   wherein a number of the power pad electrodes is less than a number of the power lines, and
   wherein the plurality of power lines is connected to the one of the plurality of bridge electrodes through a bridge hole penetrating the second buffer layer, the gate insulating layer, and the interlayer dielectric layer.

2. The display device of claim 1, wherein the plurality of bridge electrodes intersects the plurality of power lines and the plurality of data lines.

3. The display device of claim 1, further comprising a plurality of auxiliary electrodes positioned between the plurality of data lines and connected to one of the plurality of bridge electrodes.

4. The display device of claim 3, wherein the plurality of auxiliary electrodes is positioned on the same layer as the plurality of data lines.

5. The display device of claim 1, wherein some of the plurality of power lines include a first power line pattern and a second power line pattern, and the first power line pattern and the second power line pattern are connected to one of the plurality of bridge electrodes.

6. The display device of claim 5, wherein contact areas between the power lines each including the first power line pattern and the second power line pattern and the corresponding bridge electrode have different sizes.

7. The display device of claim 1, wherein the plurality of power lines include a first power line with directly connecting to one of the power pad electrodes and a second power line without directly connecting to any one of the power pad electrodes,
   wherein the first power line has a first power line pattern and a second power line pattern, and the first power line pattern and the second power line pattern are connected to the one of the plurality of bridge electrodes,
   wherein the second power line has a third power line pattern and a fourth power line pattern, and the third power line pattern and the fourth power line pattern are connected to the one of the plurality of bridge electrodes, and
   wherein a separation distance between the first power line pattern and the second power line pattern is different from the separation distance between the third power line pattern and the fourth power line pattern.

8. The display device of claim 1, wherein each of the plurality of bridge electrodes includes a plurality of openings and a plurality of bridge portions.

9. The display device of claim 8, wherein the plurality of openings and the plurality of bridge portions intersect the plurality of data lines.

10. The display device of claim 9, wherein the plurality of openings and the plurality of bridge portions are spaced apart from the plurality of power lines.

11. A display device comprising:
   a substrate including a display portion and a pad portion outside the display portion;
   a plurality of power lines positioned on the pad portion of the substrate and extended from the display portion;
   a plurality of data lines positioned in parallel with the plurality of power lines and extended from the display portion; and
   a plurality of bridge electrodes configured to connect at least two of the plurality of power lines,
   wherein only some of the plurality of power lines include a power pad electrode on at least an end of the corresponding power line, and
   wherein a number of the power pad electrodes is less than a number of the power lines.

12. The display device of claim 11, wherein the plurality of bridge electrodes intersects the plurality of power lines and the plurality of data lines.

13. The display device of claim 11, further comprising a plurality of auxiliary electrodes positioned between the plurality of data lines and connected to one of the plurality of bridge electrodes.

14. The display device of claim 13, wherein the plurality of auxiliary electrodes is positioned on the same layer as the plurality of data lines.

15. The display device of claim 11, wherein some of the plurality of power lines include a first power line pattern and a second power line pattern, and the first power line pattern and the second power line pattern are connected to one of the plurality of bridge electrodes.

16. The display device of claim 15, wherein contact areas between the power lines each including the first power line pattern and the second power line pattern and the corresponding bridge electrode have different sizes.

17. The display device of claim 11, wherein the plurality of power lines include a first power line with directly connecting to one of the power pad electrodes and a second power line without directly connecting to any one of the power pad electrodes,
   wherein the first power line has a first power line pattern and a second power line pattern, and the first power line pattern and the second power line pattern are connected to one of the plurality of bridge electrodes,
   wherein the second power line has a third power line pattern and a fourth power line pattern, and the third power line pattern and the fourth power line pattern are connected to the one of the plurality of bridge electrodes, and
   wherein a separation distance between the first power line pattern and the second power line pattern is different from the separation distance between the third power line pattern and the fourth power line pattern.

18. The display device of claim 11, wherein each of the plurality of bridge electrodes includes a plurality of openings and a plurality of bridge portions.

19. The display device of claim 18, wherein the plurality of openings and the plurality of bridge portions intersect the plurality of data lines.

20. The display device of claim 19, wherein the plurality of openings and the plurality of bridge portions are spaced apart from the plurality of power lines.

* * * * *